United States Patent [19]

Matsumura et al.

[11] Patent Number: 4,726,851
[45] Date of Patent: Feb. 23, 1988

[54] AMORPHOUS SILICON SEMICONDUCTOR FILM AND PRODUCTION PROCESS THEREOF

[75] Inventors: Mitsuo Matsumura, Kasukabe; Toshihiko Yoshida, Ohi, both of Japan

[73] Assignee: Toa Nenryo Kogyo K.K., Tokyo, Japan

[21] Appl. No.: 948,420

[22] Filed: Dec. 30, 1986

Related U.S. Application Data

[63] Continuation-in-part of Ser. No. 675,361, Nov. 27, 1984, abandoned.

[51] Int. Cl.⁴ .................. H01L 31/06; H01L 31/18
[52] U.S. Cl. .................. 136/258; 357/30 J; 357/30 K; 357/59 C; 357/30; 427/39; 437/2; 437/101
[58] Field of Search .................. 357/2, 30, 59 C, 30 J, 357/30 K; 136/258 AM; 252/62.3 R, 62.3 BT; 427/39, 74, 86; 430/86; 428/620; 29/572

[56] References Cited

U.S. PATENT DOCUMENTS

| 4,460,670 | 6/1984 | Ogawa et al. | 430/57 |
| 4,471,042 | 9/1984 | Komatsu et al. | 430/64 |
| 4,476,346 | 10/1984 | Tawada et al. | 136/249 |

FOREIGN PATENT DOCUMENTS

| 57-66624 | 4/1982 | Japan | 427/39 |
| 57-90933 | 6/1982 | Japan | 427/39 |
| 57-136377 | 8/1982 | Japan | 136/258 AM |
| 60-4211 | 6/1983 | Japan . | |
| 58-215083 | 12/1983 | Japan | 136/258 AM |

OTHER PUBLICATIONS

Yoshida et al, *Japanese Journal of Applied Physics*, vol. 25, No. 1, Jan. 1986, pp. L7–9.

*Primary Examiner*—Aaron Weisstuch
*Attorney, Agent, or Firm*—Sughrue, Mion, Zinn, Macpeak, and Seas

[57] ABSTRACT

This invention discloses an amorphous silicon semiconductor film comprising at least hydrogen, nitrogen, and oxygen as impurities and the method of producing it. The film is characterized in that the total quantity of nitrogen and oxygen in said film is at least 1 atom %. Since the film has a small light absorption coefficient and its optical refractive index is controllable, an excellent window material for solar cell can be provided. As adherence of the film with a metal electrode as well as with a transparent electrode is sufficient, good reproducibility in making solar cells using the film of this invention as window material was realized.

5 Claims, 10 Drawing Figures

FIG. 1 Infrared Absorption Spectra

AMORPHOUS SILICON SEMICONDUCTOR FILM AND PRODUCTION PROCESS THEREOF

This is a continuation-in-part of application Ser. No. 675,361, filed Nov. 27, 1984, now abandoned.

BACKGROUND OF THE INVENTION

1. Field of the Invention

This invention relates to a novel amorphous silicon semiconductor film. More particularly, the invention relates to an amorphous silicon semiconductor film which has a low light absorptivity and is suitable for use as a window material, and a process of producing such a film.

2. Description of the Prior Art

Amorphous solar cells of a p-i-n structure have drawn the attention of researchers recently because of their extremely low production cost, compared with monocrystalline solar cells, and the development of such amorphous solar cells is being promoted eagerly, because they are now considered to be the most promising type of solar cells.

It is generally known that when an amorphous silicon semiconductor of a p-i-n structure is adapted to function as a solar cell, the carriers generated by the absorption of light by amorphous silicon (these carriers are hereinafter called light-generated carriers) in the p-layer or the n-layer have a short life, and therefore light-generated carriers which can provide a photocurrent are generated in the i-layer. However, in a p-i-n type of solar cell, since the i-layer is sandwiched between the p-layer and the n-layer, light enters the i-layer after passing through the p-layer or n-layer, so that it is desirable that the p-layer or the n-layer be made of a material with a low light absorptivity. The light absoption coefficient of conventional n-type or p-type amorphous silicon is substantially equal to or greater than that of the amorphous silicon of the i-layer, so that light absoption loss in the n-layer or the p-layer is one of the causes of lowering the photoelectric conversion efficiency.

As a p-i-n type amorphous solar cell has a structure consisting of either (glass/transparent electrode/p-i-n or n-i-p/metal), or (transparent electrode/p-i-n or n-i-p/metal), light enters through the transparent electrode. In this structure, light loss due to the reflection of light by the solar cell are also a cause of reduced photoelectric conversion efficiency. In this case, in order to minimize the reflection of light at the interface between the transparent electrode and the p-layer or the n-layer, it is desirable to control the refractive index of the p-layer or the n-layer. In practice, however, the refractive index of the conventional p-layer or n-layer, for instance, is in the range of 3.4 to 3.6 at a wavelength of light of 1500 nm, the same as that of the amorphous silicon of the i-layer, which is substantially different from the refractive index of the transparent electrode, approximately 2.0, and because of this difference in refractive indices in the cell structure, reflection loss has been considered inevitable.

Another disadvantage of conventional p-i-n type amorphous silicon semiconductors is that their production yield is low because of the unsatisfactory adhesion of a p-i-n or n-i-p assembly to a stainless steel substrate and transparent electrode.

Amorphous silicon containing carbon and hydrogen as impurities (a-Si:C:H) has been proposed as a material which is free of these demerits, (Japanese Laid-Open Patent No. 126,175/82, etc.). This amorphous silicon (a-Si:C:H) can control light absorption and, in this respect, can help to improve the photoelectric conversion efficiency of a cell, but it is still unsatisfactory from the point of view of improvements in light reflection and adhesion to a stainless steel substrate and transparent electrode.

As a result of extensive studies into overcoming these demerits of the prior art, the present inventors have found that a thin film of a p-type or n-type amorphous silicon semiconductor obtained from the plasma decomposition of a mixture consisting of at least one gas selected from silanes $Si_nH_{2n+2}$ and their derivatives and fluoro silanes, such as $Si_2F_6$, $Si_2F_xH_{6-x}$, or their derivatives, and at least one gas selected from NO, $NO_2$ and ($N_2+O_2$) contains at least hydrogen, nitrogen, and oxygen as impurities (this amorphous silicon semiconductor is hereinafter referred to s a-Si:H:N:O), and that it has a small light absorption coefficient. Moreover the refractive index of thus-obtained a-Si:H:N:O can be controlled, so that it is ideal for use as a window material for photoelectric converter elements with p-i-n junctions. The present invention was achieved on the basis of this novel finding.

Accordingly, it is a first object of this invention to provide a p-type or n-type amorphous silicon semiconductor which has a small light absoption coefficient, and a process of producing it.

It is a second object of this invention to provide a p-type or n-type amorphous silicon semiconductor which enables controlling the refractive index thereof to minimize reflection loss, and a process of producing such a semiconductor.

It is a third object of this invention to provide a window material for p-i-n type semiconductors which has an improved adhesion to both a stainless steel substrate and a transparent electrode, and a process of producing such a window material.

DISCLOSURE OF THE INVENTION

These objects have been achieved by a thin film of an amorphous silicon semiconductor characterized by comprising at least hydrogen, nitrogen, and oxygen as impurities, and further characterized in that the total quantity of oxygen and nitrogen within the film is at least 1 atom %, and by a process of producing such an amorphous silicon semiconductor film. Preferably, the total quantity of oxygen and nitrogen within the film is 1 to 4 atom %.

The amorphous silicon semiconductor film of the present invention can be produced by introducing specific gases into a vacuum reactor, adjusting the internal pressure of the reactor to a predetermined level, and then subjecting the gas mixture to ordinary plasma decomposition or heating the gas mixture to a high temperature. The term "plasma decomposition" used in this specification refers to a technique of forming a silicon film on a substrate in a plasma atmosphere. This plasma atmosphere can easily be realized by various known discharge methods such as high-frequency discharge, low-frequency discharge, or DC discharge, etc.

To form a silicon film containing at least hydrogen, nitrogen, and oxygen as impurities in a plasma atmosphere, it is necessary that at least silicon atoms, hydrogen atoms, nitrogen atoms, and oxygen atoms, or their ions, are able to exist in the plasma.

As is well known, when producing a silicon film containing hydrogen as a impurity by so-called plasma decomposition, a plasma atmosphere is created by discharging a feed gas of a hydrogen containing silicon compound such as silanes $Si_nH_{2n+2}$ or their derivatives, in this case hydrogen may be used as a carrier; and if adding oxygen to the feed gas, it is possible to produce a silicon film containing oxygen and hydrogen as impurities. However, when adding oxygen, the use of hydrogen as a carrier gas results in the danger of explosion, but if a silicon film is formed by using a gas mixture of this combination outside the explosion limit, it is difficult to introduce the required quantities of hydrogen and oxygen into the thin film (see, for instance, Japanese Laid-Open Patent No. 77020/82), and in such a case discharge conditions must be strictly selected.

The physical properties of an amorphous silicon semiconductor film depend to a large extent on the types and quantities of impurities contained in the film, and the physical properties, especially its absorption coefficient and adhesiveness to a metal substrate and/or transparent electrode, are affected to a large extent by the quantities of oxygen and/or nitrogen contained as impurities in the film. As the presence of nitrogen and oxygen in the amorphous silicon semiconductor of this invention partly provides silicon nitride (band gap: ~5.0 eV) and silicon oxide (band gap: 9.0 eV) which have wide band gaps, the band gap of the a-Si of this invention is widened to reduce its absorption coefficient.

As for its refractive index, because of the localized presence of silicon nitride (refractive index: 2.05) and silicon oxide (refractive index: 1.46) structures, it is possible to control the refractive index of the resultant a-Si semiconductor by controlling the total quantity of nitrogen atoms and oxygen atoms which are introduced into the film as impurities. The refractive index of the film of this invention can be about 2.0 to 3.4, preferably about 2.8 to 3.4.

In addition, nitrogen and oxygen, which can enter the four-coordinated Si network, act to relieve structural stress within an amorphous silicon semiconductor film, resulting in an improved adhesion to both a metal substrate and transparent electrode.

On the other hand, hydrogen contained as an impurity in the amorphous silicon semiconductor film of the present invention acts to eliminate dangling bonds of silicon atoms produced during the formation of the amorphous silicon film, reducing the density of the localized states in the silicon film. This is of great significance when controlling electric resistance of the semiconductor element according to the present invention.

Thus, by also introducing a p-type or n-type dopant into the amorphous silicon semiconductor, it is possible to produce a p-type or n-type amorphous silicon semiconductor film which has an improved absorption coefficient as well as an improved adhesion to a metal substrate or transparent electrode.

A characteristic feature of the amorphous silicon of the present invention, which has an improved absorption coefficient and adhesion to a metal substrate or transparent electrode, is that the total quantity of nitrogen and oxygen within the film is at least 1 atom % (the unit atom % in this case is given by $((N+O)/(Si+N+O)) \times 100$, no matter what other impurities are present. This feature can not be easily realized by known methods, but can only be achieved by using the following specific film formation conditions:

Power density: 0.01-2 W/cm²
Gas flow rate: 1-100 SCCM
Substrate temperature: 100°-400° C.
Pressure during discharge: 0.05-2 Torr
(Nitrogen and Oxygen sources/Si source) ratio: 0.001-0.5 (by volume).

Considering the film-formation speed, etc., the following conditions are more preferable:
Power density: 0.01-0.5 W/cm²
Gas flow rate: 1-50 SCCM
Substrate temperature: 150°-350° C.
Pressure during discharge: 0.05-1 Torr
(Nitrogen and Oxygen sources/Si source) ratio: 0.005-0.1 (by volume).

Wherein, the nitrogen and oxygen sources are at least one or a mixture of two or more gases selected from $NO$, $N_2O$, $NO_2$, and $(N_2+O_2)$.

The Si source used in this invention is at least one or a mixture of two or more gases selected from silanes represented by the general formula $Si_nH_{2n+2}$, derivatives thereof, such as $Si_nX_mH_{2n+2-m}$ (wherein X is a halogen atom). The pressure during discharge means the total pressure of gases in the film formation chamber during the period of the discharge. Therefore, when using a rare gas as carrier gas, the pressure of this rare gas is also included in the total pressure.

To endow a p-type or n-type character to the silicon film of this invention, it is necessary to add a dopant gas in addition to these film formation conditions. Elements in Group III of the Periodic Table, or their compounds, can be used as a p-type dopant gas and among these a hydride, especially boron hydride ($B_2H_6$), is preferred. Elements in Group V of the Periodic Table, or their compounds, preferably hydrides, especially phosphine ($PH_3$) or arsine ($AsH_3$), can be used as an n-type dopant gas.

Aluminum, antimony, stainless steel and the like can be cited as typical examples of the material of the metal electrode used as a substrate in this invention.

In the graph, the broken line represents the conventional a-Si film and the solid line represents the film of this invention.

Figure 3:
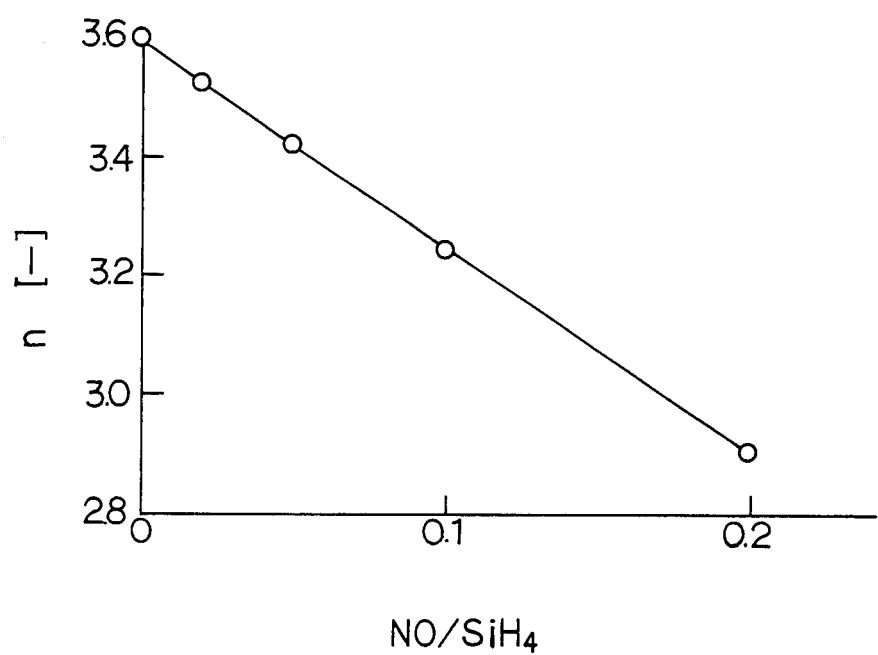

FIG. 3 shows the NO/SiH₄ ratio (when an a-Si:H:N:O film is formed) dependency of the refractive index, at a wavelength of 1,500 nm, of the a-Si:H:N:O film of the present invention.

FIG. 3' of the Drawing shows N+O atom % plotted against refractive index, in which the solid circles ● correspond to the data of FIG. 3 while the hollow circles ○ plot data obtained from an a-Si film prepared under deposition conditions of $SiH_4/H_2 = 1/9$, $B_2H_6/SiH_4 = 0.002$, power density = 0.08 W/cm², pressure = 0.1 Torr, substrate temperature = 250° C. and gas flow rate = 5 SCCM.

Figure 4:
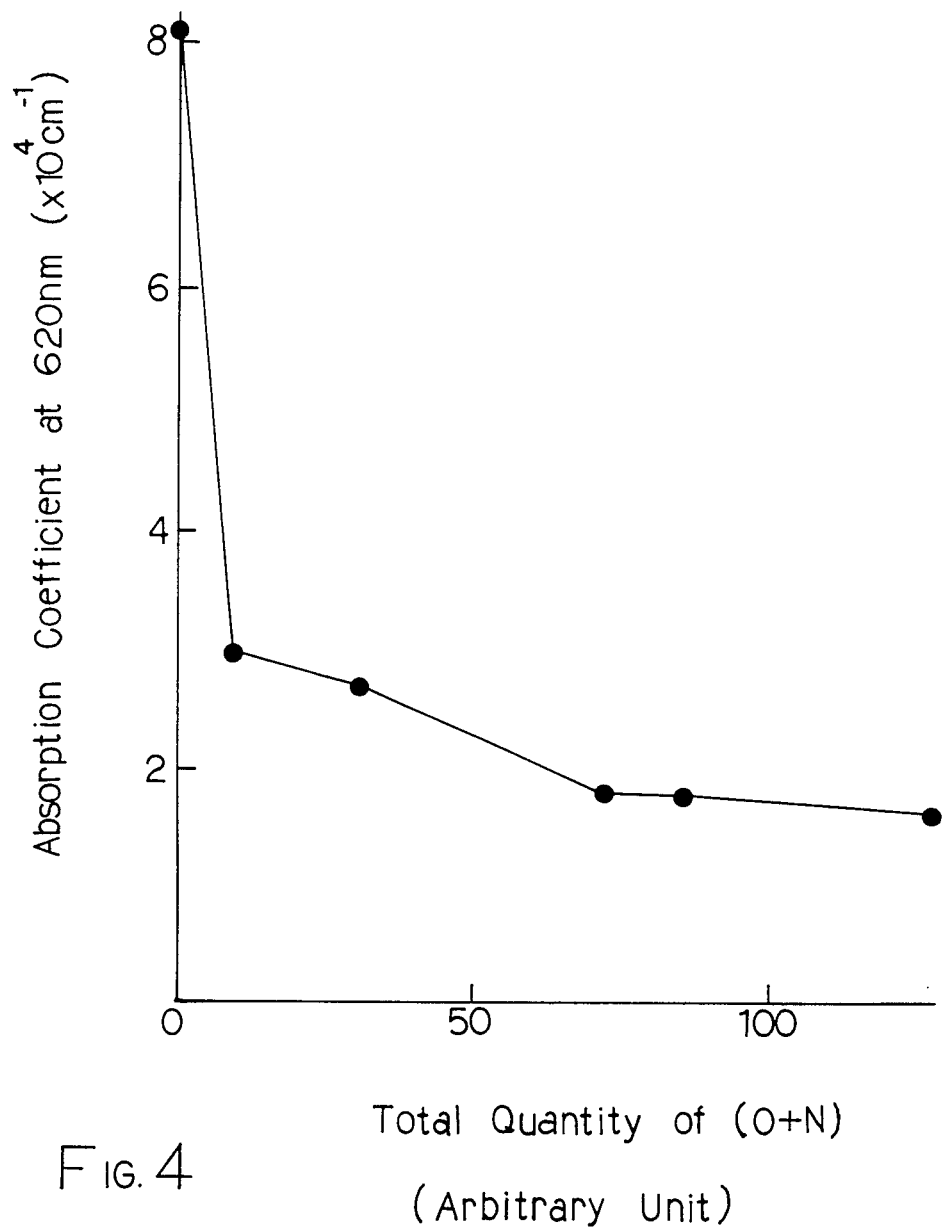

FIG. 4 is the graph illustrating the fact that the absorption coefficient of the a-Si:H:N:O thin film obtained in this invention decreases when total quantity of oxygen atoms and nitrogen atoms as impurities increases.

FIG. 5(A) shows the paths of reflected light in an a-Si semiconductor element. In the drawing, reference numeral 1 denotes glass, 2 a transparent electrode and 3 an amorphous silicon layer.

FIG. 5(B) is a graph of a comparison of the reflectivities of an amorphous silicon layer obtained according to this invention and an amorphous silicon layer obtained according to a conventional method. In the graph, the broken line represents the conventional layer and the solid line represents the layer according to the present invention.

Figure 6:
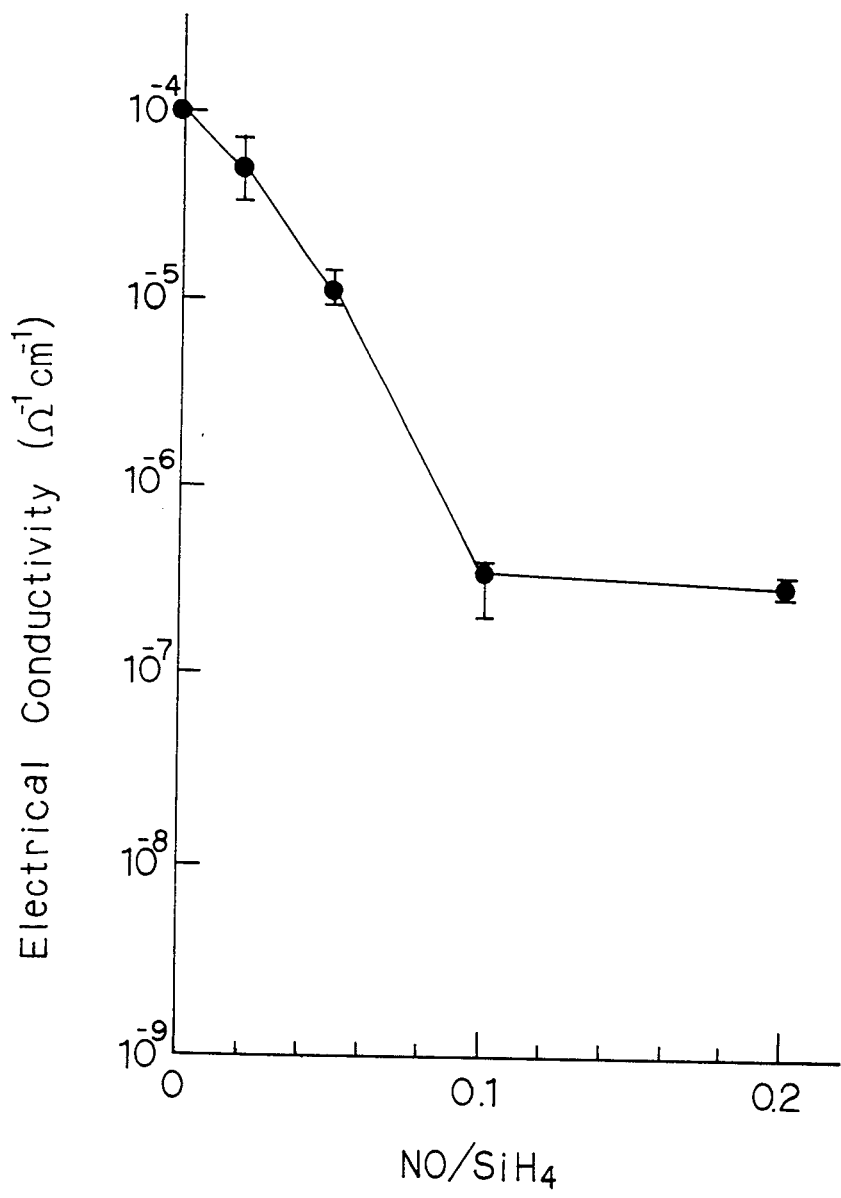

FIG. 6 is a graph showing the NO/SiH$_4$ ratio dependency of the electrical conductivity of the produced amorphous silicon film in the present invention.

Figure 7:
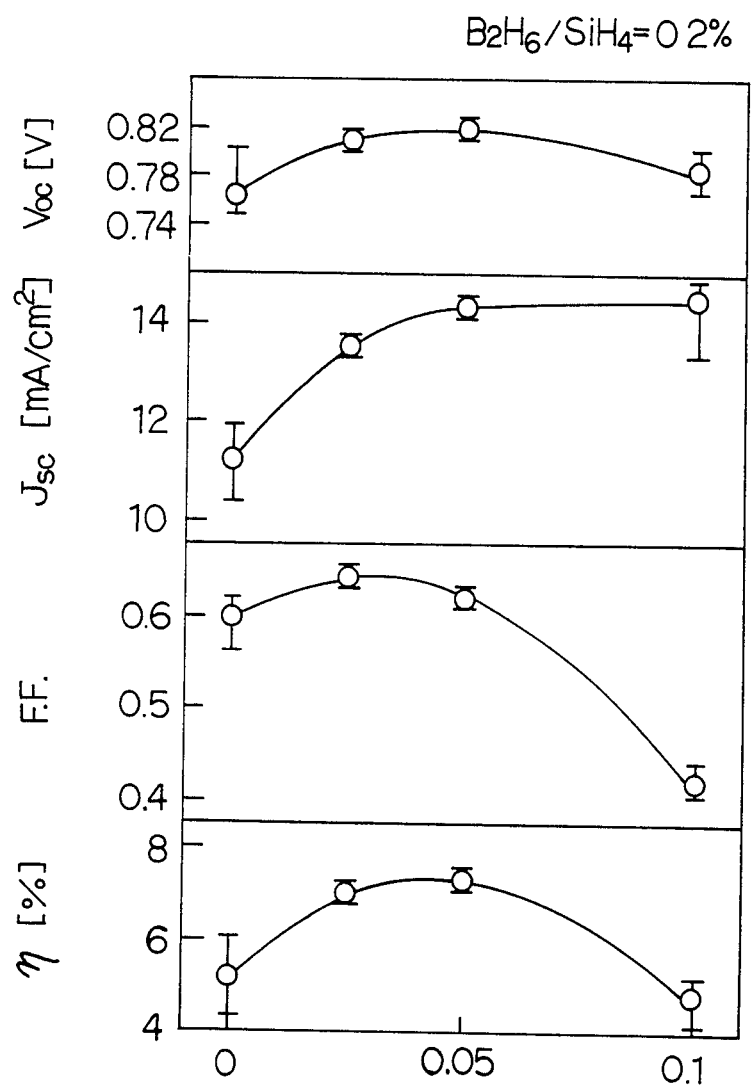

FIG. 7 is a graph showing NO/SiH$_4$ ratio dependency of solar cell characteristics. In the drawing Voc, Jsc, F.F. and $\eta$ mean open circuit voltage, short circuit current, fill factor and photoelectric conversion efficiency of a solar cell, respectively.

Figure 8:
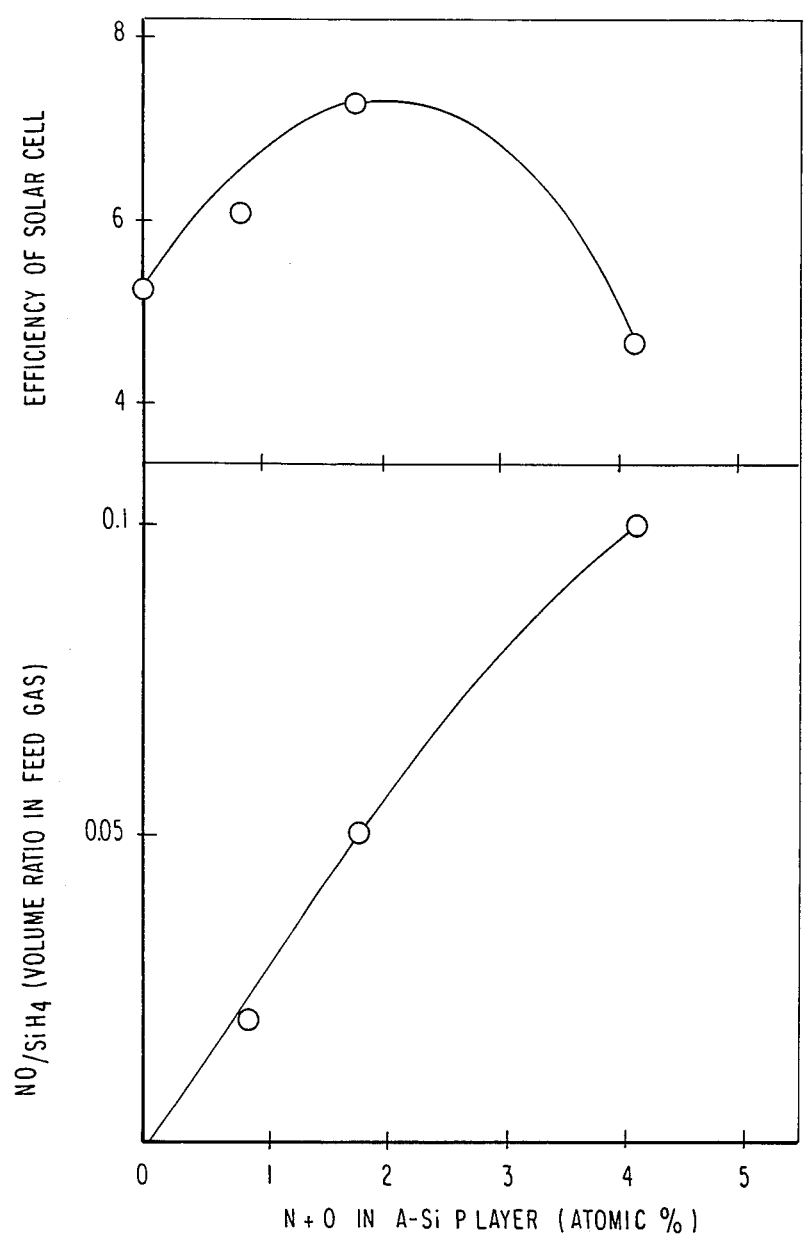

FIG. 8 plots N+O atom % versus NO/SiH$_4$ volume ratio in feed gas and against solar cell efficiency in which the deposition conditions for the N+O-containing layer were the same as those used in generating the data for FIG. 7 and the data depicted by the open (hollow) circles ○ of FIG. 3'.

FIG. 9 plots efficiency as a function of light exposure time for a number of cells using p-layers of a-Si films containing H, O+H, N+H or N+O+H.

DESCRIPTION OF THE MOST PREFERRED EMBODIMENTS

The following examples are provided to illustrate the present invention, but are not to be construed as limiting the present invention in any way.

EXAMPLE 1

The p-type a-Si:H:N:O film was prepared according to the present invention. In this case, the film was produced from mixed gases having ratios NO/SiH$_4$=0.1, B$_2$H$_6$/SiH$_4$=0.01 and SiH$_4$/Ar=0.33 under the following plasma discharge decomposition conditions:

Power density=0.03 W/cm$^2$;
Pressure during discharge=1 Torr;
Substrate temperature=250° C.;
Gas flow rate=33 SCCM (standard cubic centimeters).

Figure 1:
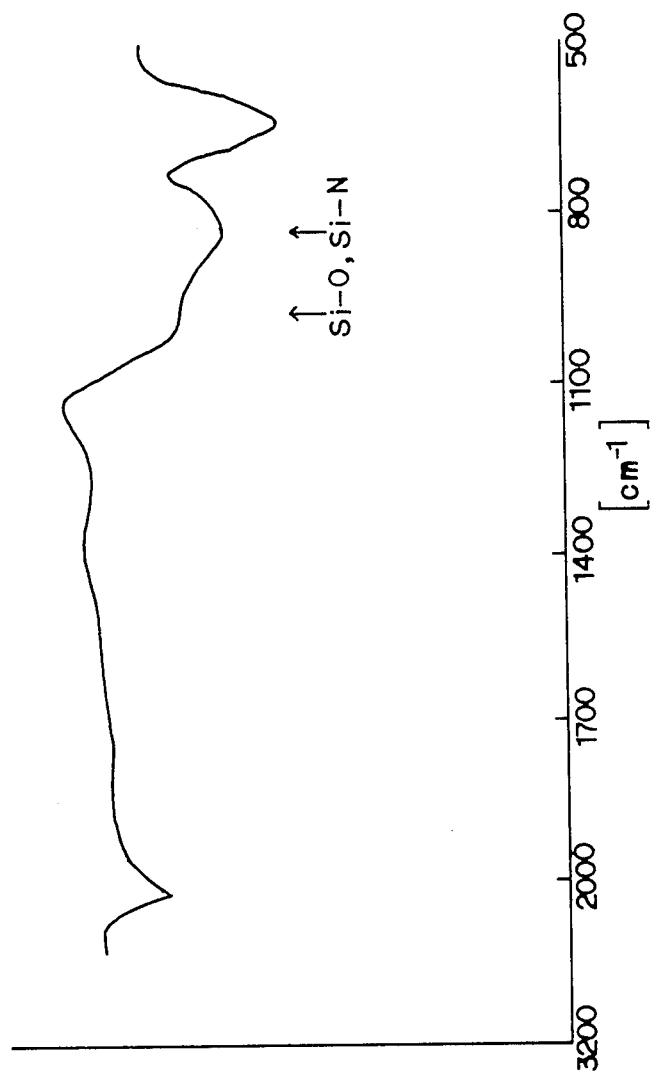
FIG. 1 is infrared spectra of the p-type a-Si:H:N:O obtained according to this invention.

FIG. 1 shows infrared spectroscopic data of a thin film obtained under the above film formation conditions. Marked absorption is seen at wave numbers close to 1,000 cm$^{-1}$ and 840 cm$^{-1}$, which indicates the presence of a Si-O bond and a Si-N bond. This confirmed that this film is an amorphous silicon semiconductor film containing nitrogen and oxygen.

Figure 2:
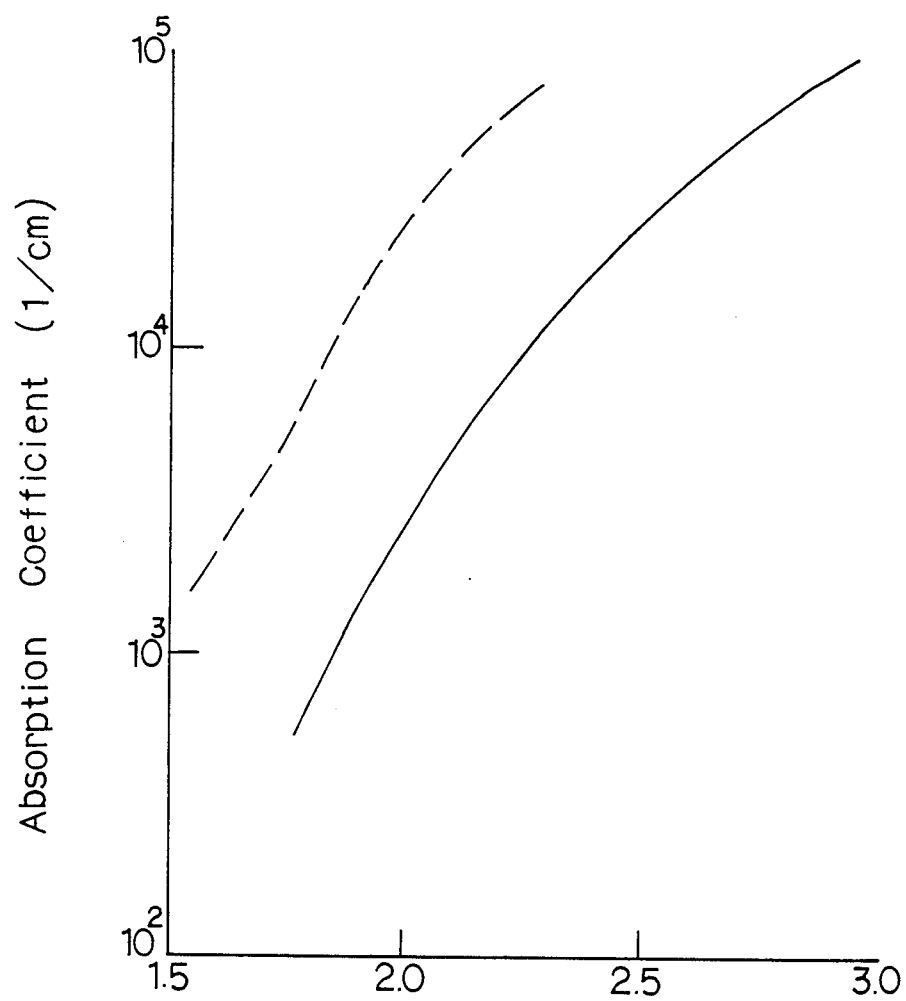
FIG. 2 is a graph of a comparison of the light absorption coefficient of a conventional p-type a-Si film with that of the p-type a-Si:H:N:O film obtained according to the present invention.

FIG. 2 shows the energy dependency of the light absorption coefficient of a p-type a-Si film. It can be seen that the p-type a-Si:H:N:O film obtained in the present invention has a smaller light absorption coefficient than the conventional amorphous silicon semiconductor film, which corroborates the effect of this invention.

EXAMPLE 2

NO/SiH$_4$ ratio dependency of the refractive index of an amorphous silicon semiconductor of present invention was examined. In this case said amorphous silicon film was produced from mixed gases having ratios of SiH$_4$/H$_2$=1/9 and B$_2$H$_6$/SiH$_4$=0.01 under the following fixed film formation conditions:

Power density=0.24 W/cm$^2$;
Pressure during discharge=1 Torr;
Substrate temperature=250° C.;
Gas flow rate=30 SCCM.

The results are shown in FIG. 3 and this figure verifies that the refractive index of an amorphous silicon semiconductor film of this invention can be controlled by adjusting the NO/SiH$_4$ ratio.

Determining the total amount of (N+O) in thus prepared film by using Secondary Ion Mass Spectroscopy (manufactured by VG Scientific Ltd.), the relation between the total amount of (N+O) in the film and the refractive index were obtained as shown in FIG. 3'.

For this measurement, Ar gas was used as probe gas and the density of a-Si:H was assumed as 2.2 g/cm$^2$. In the FIG. 3', solid circles "●" correspond to FIG. 3 but open circles "○" correspond to a film obtained under the deposition condition of;

B$_2$H$_6$/SiH$_4$=0.002
Power density=0.08 W/cm
Pressure during discharge=0.1 Torr
Substrate temperature=250° C.
Gas flow rate=5 SCCM.

These results are consistent with the well known fact that the refractive index changes depending on an amount of B$_2$H$_6$ added in a raw gas.

The total quantity of oxygen and nitrogen atoms contained in the a-Si:H:N:O of present invention as impurities was estimated from the area of infrared absorption. The absorption coefficient depends on the above mentioned total quantity of oxygen and nitrogen atoms. FIG. 4 shows this fact in the case of absorption coefficient at 620 nm. These results illustrate that the absorption coefficient depends on the quantities of oxygen and nitrogen atoms contained in the a-Si:H:N:O semiconductor, and that the absorption coefficient decreases remarkably when small amounts of oxygen and nitrogen atoms are contained in the film.

EXAMPLE 3

FIG. 5(B) shows the results of a comparison of the light reflectivities of a sample with a glass/transparent electrode/p-type a-Si:H:N:O structure using an amorphous silicon semiconductor film according to this invention, and a conventional sample with a glass/transparent electrode/p-type a-Si:H structure. From these results, it was determined that the reflection of light at the interface between the amorphous silicon semiconductor film of this invention and the transparent electrode was less than that in the conventional product. It was also ascertained that the reflection of light is also reduced in a p-i-n type of solar cell using the amorphous silicon semiconductor film of this invention as a window material, so that the photoelectric conversion efficiency of the cell as a whole should be improved.

Figure 5:
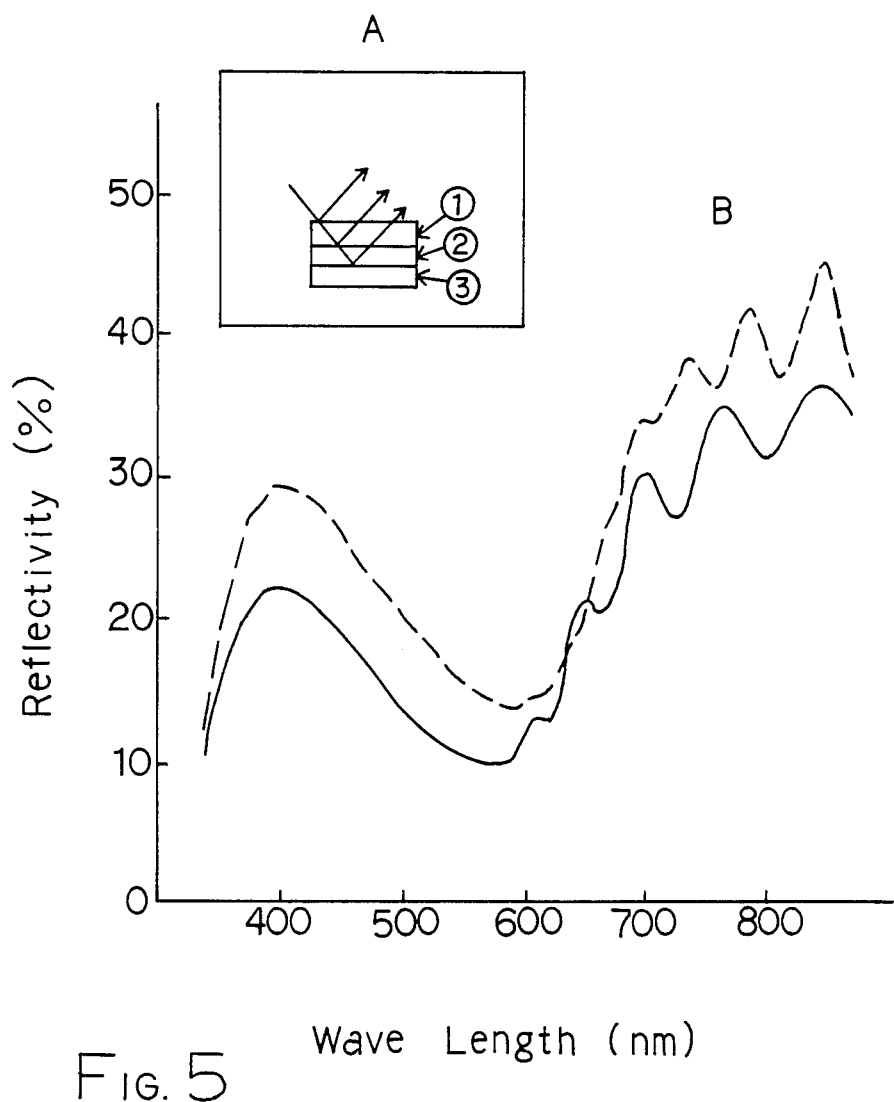

In FIG. 5, Inset (A) shows the paths of reflected light in an a-Si semiconductor element.

EXAMPLE 4

FIG. 6 shows the NO/SiH$_4$ ratio dependency of electrical conductivity of amorphous silicon semiconductor film obtained in this invention. The film formation conditions for each film were as follows:

SiH$_4$/H$_2$—1/9
B$_2$H$_6$/SiH$_4$=0.01,
Power density=0.24 W/cm$^2$,
Pressure in chamber during discharge=1 Torr;
Substrate temperature=250° C.,
Gas flow rate=30 SCCM.

Each sample was verified as being p-type by a measurement of its thermoelectromotive force. Since each of the samples showed an electrical conductivity of at least $10^{-7} \Omega^{-1} \cdot cm^{-1}$, its suitability as a p-layer for a solar cell was verified.

EXAMPLE 5

When films were formed on a stainless steel or transparent electrode substrate under the following conventional film formation conditions:
 $SiH_4/H_2=1$,
 $B_2H_6/SiH_4=0.01$;
 Power density $=0.24$ W/cm$^2$;
 Pressure in chamber during discharge $=100$ mm Torr;
 Substrate temperature $=250°$ C.;
 Gas flow rate $=10$ SCCM;
the films were not always formed with a good reproducibility, and formed films were often cloudy. This clouding is due to non-uniform adhesion of the film to the substrate, and it may cause a leakage current in a p-i-n type solar cell.

When films were formed under the same conditions, but with NO added to give a NO/SiH$_4$ ratio of 0.05, the films did not become cloudy, and could be formed with good reproducibility. These facts verify that the addition of nitrogen and oxygen as impurities into an amorphous silicon film improves the adherence of the film to the substrate.

EXAMPLE 6 p-i-n type solar cells having a p layer produced according to the present invention were prepared. The p layer forming conditions were as follows;
 $B_2H_6/SiH_4=0.002\%$
 Power density $=0.08$ W/cm$^2$
 Pressure in chamber $=100$ m Torr
 Substrate temperature $=250°$ C.
 Silane gas flow rate $=5$ SCCM.

The cell structure was Glass/ITO/SnO$_2$/p-i-n/Al, wherein p layer was set up for light incident side. ITO represents indium tin oxide. The characteristics of these cells depends on those of the p layer, which is controlled by the forming conditions.

The deposition conditions of the i-layer were,
 SiH$_4$: 100%
 Power density $=0.08$ W/cm
 Pressure during discharge $=100$ m Torr
 Substrate temperature $=250°$ C.
 Silane gas flow rate $=5$ SCCM,
and the deposition conditions of the n-layer were
 PH$_3$/SiH$_4=0.01$
 Power density $=0.2$ W/cm
 Pressure during discharge $=100$ m Torr
 Substrate temperature $=250°$ C.
 Silane gas flow rate $=10$ SCCM.

FIG. 7 shows the NO/SiH$_4$ ratio dependency of solar cell characteristics. In the drawing, Voc, Jsc and F.F. mean open circuit voltage, short circuit current and fill factor, respectively, and $\eta$ represents photoelectric conversion efficiency of solar cell. It is obvious from FIG. 7 that $\eta$ has an optimum point against NO/SiH$_4$ ratio.

Using Secondary Ion Mass Spectroscopy (Manufactured by VG Scientific LTD.), quantities of N/Si and O/Si in each p-layer deposited under the above conditions were determined.

For this measurement Ar gas was used as a probe gas and the density of a-Si:H was assumed as 2.2 g/cm$^3$.

The total amount of (N+O) in each p-layer in relation to NO/SiH$_4$ ratio of the raw gas was plotted in FIG. 8.

Next, the light induced change of cell efficiency of the cell using a p-layer deposited under a condition of NO/SiH $=0.05$ was examined together with three other cells in which the p-layer was a-Si:N:H, a-Si:H and a-Si:O:H, respectively. Results are shown in FIG. 9 as a function of AMI 100 mW/cm light exposure time. This fact indicates that the present invention improves the p-i-n type amorphous silicon solar cell characteristics.

POSSIBILITY OF INDUSTRIAL USES

As can be appreciated from the above description, the present invention can provide a semiconductor which has a small light absorption coefficient and an optimal refractive index, and this semiconductor is extremely useful as a material on the light-incidence side of a p-i-n type of amorphous solar cell.

What is claimed is:

1. A solar cell including an amorphous silicon semiconductor film as a window of said solar cell, said film having a refractive index of 2.8 to 3.4, the total quantity of nitrogen and oxygen within said film being from 1 to below 4 atom %.

2. The solar cell of claim 1 wherein the amorphous silicon semiconductor film has been turned into a n-type semiconductor by doping with at least one element selected as required from the elements in Group V of the Periodic Table.

3. The solar cell of claim 1 wherein the amorphous silicon semiconductor film has been turned into a p-type semiconductor by doping with at least one selected as required from the elements in Group III of the Periodic Table.

4. A process of producing an amorphous silicon semiconductor thin film as a window layer for a solar cell, said film containing at least hydrogen, nitrogen, and oxygen as impurities, the total amount of nitrogen and oxygen being in the range from 1 atom % to below 4 atom % and having a refractive index of 2.8 to 3.4, characterized by using as a starting material one or more gaseous substance selected from the group consisting of silane, polysilane or their derivatives, and further characterized by using at least one gas selected from the group consisting of NO, NO$_2$, and (N$_2$+O$_2$) and decomposing these starting materials by plasma glow discharge under the following conditions;
 Power density: 0.01–2 W/cm$^2$,
 Gas flow rate: 1–100 SCCM
 Substrate temperature: 100°–400° C.
 Pressure during discharge: 0.05–2 Torr,
 (nitrogen and oxygen sources/Si source) ratio: $<0.1$ (by volume),
to form said silicon thin film as a window layer on a substrate.

5. A process of producing an amorphous silicon semiconductor film of claim 4, wherein the discharge conditions are selected as,
 Power density: 0.01–0.5 W/cm$^2$
 Gas flow rate: 1–50 SCCM
 Substrate temperature: 150°–350° C.
 Pressure during discharge: 0.05–1 Torr and
 (Nitrogen and Oxygen sources/Si source) ratio: $<0.1$ (by volume).

* * * * *